United States Patent
Yoshidome et al.

(10) Patent No.: US 6,926,774 B2
(45) Date of Patent: Aug. 9, 2005

(54) PIEZOELECTRIC VAPORIZER

(75) Inventors: Ted G. Yoshidome, Oakland, CA (US); Joel M. Huston, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 397 days.

(21) Appl. No.: 09/991,317

(22) Filed: Nov. 21, 2001

(65) Prior Publication Data

US 2003/0094133 A1 May 22, 2003

(51) Int. Cl.[7] .............................................. C23C 16/00
(52) U.S. Cl. ...................................... 118/726; 118/715
(58) Field of Search .................................. 118/726, 715

(56) References Cited

U.S. PATENT DOCUMENTS

| | | | |
|---|---|---|---|
| 4,748,313 A | 5/1988 | de Rudnay | 219/271 |
| 4,875,658 A | 10/1989 | Asai | 129/21 |
| 5,299,919 A | 4/1994 | Paul et al. | 417/387 |
| 5,630,878 A | 5/1997 | Miyamoto et al. | 118/715 |
| 5,919,332 A | 7/1999 | Koshiishi et al. | 156/345 |
| 5,925,189 A * | 7/1999 | Nguyen et al. | 118/726 |
| 5,989,635 A | 11/1999 | Kawahara et al. | 427/255.32 |
| 6,176,930 B1 | 1/2001 | Koai et al. | 118/715 |
| 6,267,820 B1 * | 7/2001 | Chen et al. | 118/726 |

* cited by examiner

*Primary Examiner*—P. Hassanzadal
*Assistant Examiner*—Sylvia R. MacArthur
(74) *Attorney, Agent, or Firm*—Moser, Patterson & Sheridan, LLP

(57) ABSTRACT

An apparatus for controlling the flow of liquid material from a liquid material source to a process chamber is disclosed. The apparatus comprises an injector/vaporizer disposed proximate to the process chamber. The injector/vaporizer includes one or more piezoelectric grids located proximate to a vaporization chamber. The one or more piezoelectric grids function to control the flow of liquid material into the vaporization chamber. Each piezoelectric grid includes interlocking arrays of stripes attached to a frame.

26 Claims, 5 Drawing Sheets

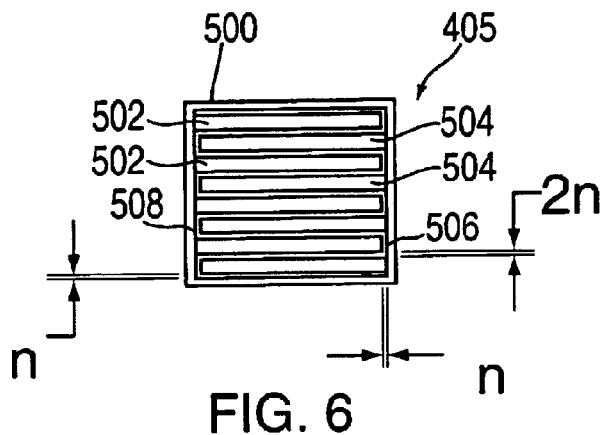
FIG. 6
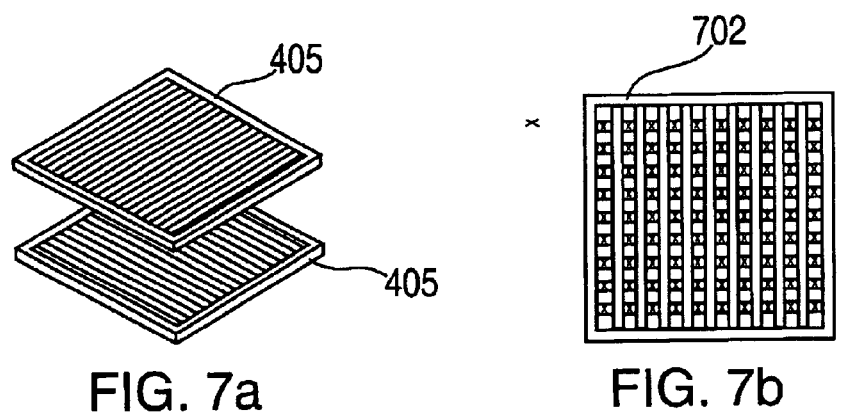
FIG. 7a
FIG. 7b
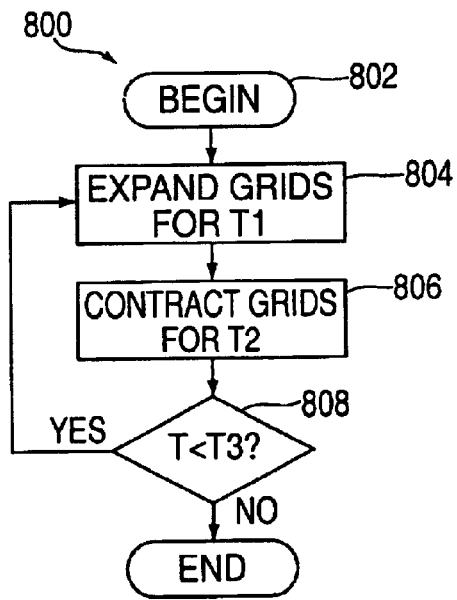
FIG. 8

PIEZOELECTRIC VAPORIZER

BACKGROUND OF THE DISCLOSURE

1. Field of the Invention

The present invention relates to the field of manufacturing integrated circuits and, more particularly to an apparatus for controlling the flow of process material into a thin film deposition chamber.

2. Description of the Background Art

Chemical vapor deposition (CVD) processes are widely used to deposit material layers on semiconductor devices and integrated circuits. These CVD processes deposit material layers on semiconductor devices and integrated circuits by reacting gaseous precursors adjacent to the surfaces thereof. The reaction rate for CVD processes is controlled via temperature, pressure and precursor flow rates.

Some precursors are derived from low vapor pressure liquids. The low vapor pressure liquids are transported using a bubbler (or boiler). The bubbler includes an ampoule containing a source of the liquid precursor. A carrier gas provided to the ampoule saturates the liquid precursor and transports the vapor to a process chamber. The amount of vapor transported depends on the process chamber pressure, the carrier gas flow rate, as well as the vapor pressure in the ampoule containing the source of liquid precursor. As such, the flow rate of vaporized precursor is difficult to control, which decreases the quality of material layers produced therefrom.

Additionally, liquid precursor shut-off is problematic due to residual liquid precursor in the lines between the ampoule and the process chamber. This residual liquid precursor may be continuously leaked into the process chamber after shut-off resulting in chamber and/or substrate contamination.

Thus, there is a need to provide an apparatus for improved control of a liquid precursor to a process chamber.

SUMMARY OF THE INVENTION

An apparatus for controlling the flow of liquid material from a liquid material source to a process chamber is disclosed. The apparatus comprises an injector/vaporizer disposed proximate to the process chamber. The injector/vaporizer includes one or more piezoelectric grids located proximate to a vaporization chamber. The one or more piezoelectric grids function to control the flow of liquid material into the vaporization chamber. Each piezoelectric grid includes interlocking arrays of strips attached to a frame.

BRIEF DESCRIPTION OF THE DRAWINGS

The teachings of the present invention can be readily understood by considering the following detailed description with the accompanying drawings, in which:

FIG. 6 illustrates a top view of a grid including interlocking arrays of strips attached to a frame;

FIG. 7A illustrates two or more grids stacked perpendicular to one another;

FIG. 7B is a top view of the grids depicted in FIG. 7A showing that the interlocking arrays of strips form a plurality of pores;

FIG. 8 is a flow diagram illustrating the operation of the injector/vaporizer.

DETAILED DESCRIPTION

Figure 1:
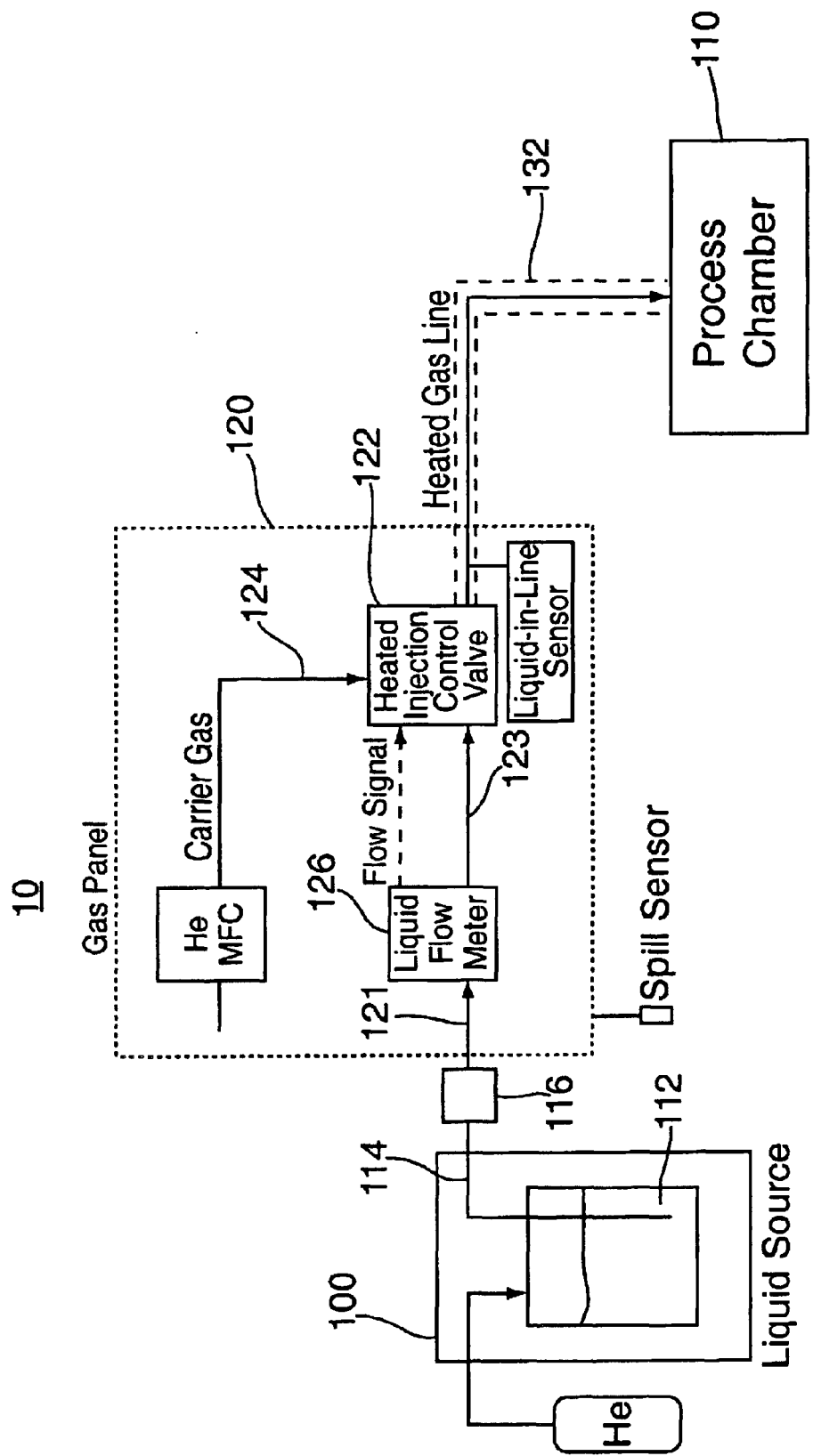
FIG. 1 is a schematic illustration of an apparatus that can be used for the practice of embodiments described herein.

FIG. 1 is a schematic representation of a deposition system 10 that can be used to perform integrated circuit fabrication in accordance with embodiments described herein. The deposition system 10 typically includes a precursor delivery system 100, a process chamber 110, and a gas delivery system 120, along with other hardware components such as power supplies (not shown) and vacuum pumps (not shown). Examples of such a deposition system include TxZ™ systems and DxZ™ systems, commercially available from Applied Materials, Inc., Santa Clara, Calif.

In the precursor delivery system 100, a liquid precursor 112 is delivered to a gas delivery system 120 through conduction line 114. A pressure regulator 116 is connected to the conduction line 114 between the precursor delivery system 110 and the gas delivery system 120. The pressure regulator pressurizes the liquid precursor within a range of about 10 psi to about 100 psi.

In the gas delivery system 120, a carrier gas, such as, for example, helium (He), is provided to an injector/vaporizer 122 via conduction line 124. An optional liquid flow meter (LMF) 126 connected to conduction lines 121, 123 monitors the flow rate of liquid precursor to the injector/vaporizer 122.

The gas delivery system 120 communicates with a showerhead (not shown) in the process chamber 110. Process gases such as vaporized liquid precursor and/or carrier gas flow from the injector/vaporizer 122 to the process chamber 110 through heated conduction line 132.

Figure 2:
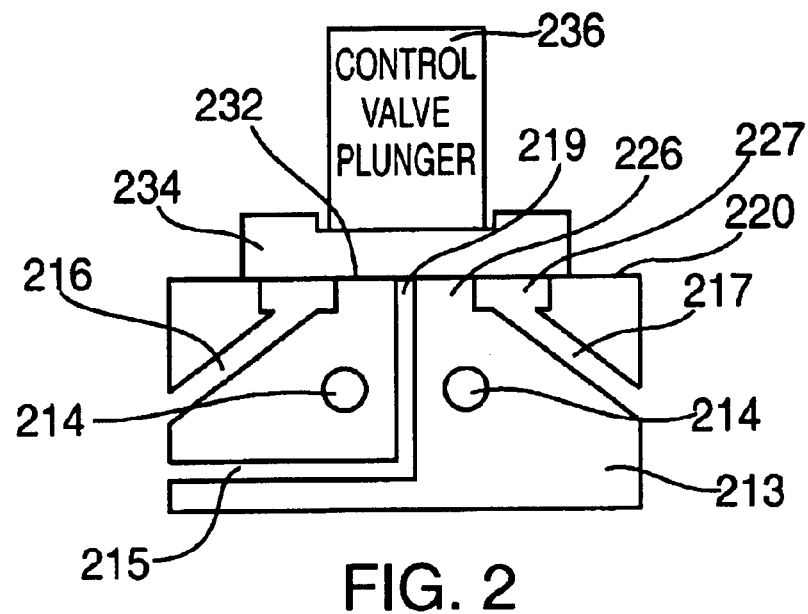
FIG. 2 is a schematic illustration of an injector/vaporizer used for the practice of embodiments described herein.

Referring to FIG. 2, the injector/vaporizer 122 comprises a body block 213 made of metallic materials superior in thermal conductivity, heat resistance and corrosion resistance such as, for example, stainless steel. The body block 213 includes at least one heater 214.

A liquid material inlet passage 215 and a gas outlet passage 216 are formed within the body block 213 without crossing each other. A liquid material outlet opening 219 for the liquid material inlet passage 215 opens onto an upper surface 220 of the body block 213, so as to introduce a liquid material (LM) into a vaporizing chamber 232.

The gas outlet passage 216 opens onto the upper surface 220 of the body block 213, such that a gas (G) generated in the vaporizing chamber 232 exits the body block 213 therethrough. A carrier gas inlet passage 217 also opens onto the upper surface 220 of the body block 213. The carrier gas mixes with the vaporized liquid material in the vaporizing chamber and carries it out through the gas outlet passage 216.

Figure 3:
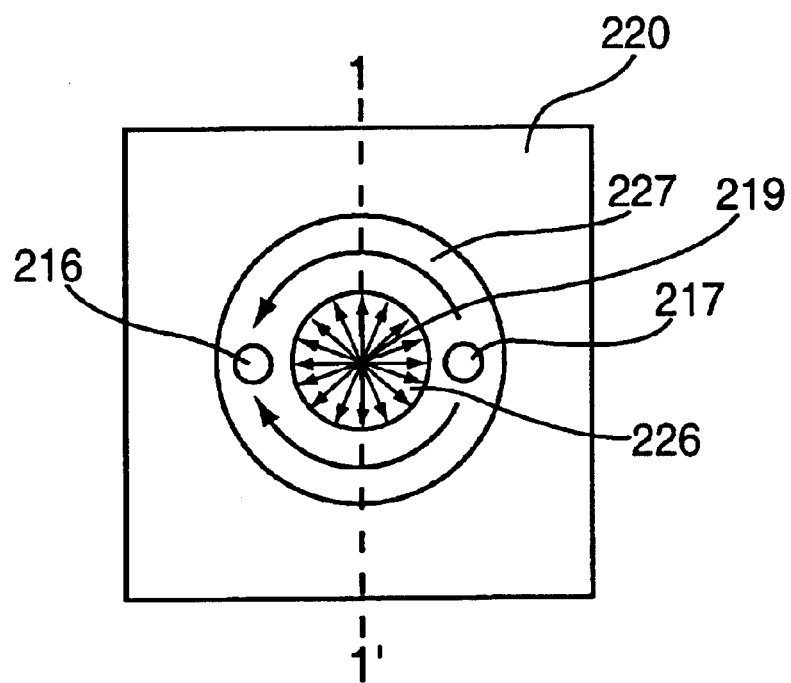
FIG. 3 is a top view of the vaporizing chamber of the injector/vaporizer shown in FIG. 2.

Referring to FIG. 3, the liquid material outlet opening 219 on the upper surface 220 of the body block 213 opens at a central portion 226 thereof. A groove 227 that is concentric with the liquid material outlet opening 219 is formed around the central portion 226. The gas outlet passage 216 and the carrier gas inlet passage 217 are also encompassed by the groove 227.

Typically, the inside diameter of the liquid material outlet opening 219 has dimensions of about 0.5 mm (millimeters) to about 1.5 mm. The inside diameter of the gas outlet passage 216 and the carrier gas inlet passage 217 have dimensions of about 2 mm to about 4 mm. The distance from the liquid material outlet opening 219 to the groove 227 formed concentrically therewith is about 3 mm to about 6 mm. The dimensions of the liquid material outlet opening 219, the gas outlet passage 216, the carrier gas inlet passage, as well as the distance between the liquid material outlet opening 219 and the groove 227 may be variable depending on the volume of liquid material (LM) introduced through the liquid material inlet passage 215.

Referring again to FIG. 2, a diaphragm 234 and control valve plunger 236 is positioned on the upper surface 220 of the body block 213 over the groove 227. The diaphragm 234 along with the control valve plunger 236 functions to shut-off the flow of the gas (G) generated in the vaporizing chamber 232 through the gas outlet passage 216. The diaphragm 234 is pressed by the control valve plunger 236 against the central portion 226 to stop the flow of liquid material from the liquid material outlet opening 219 into the vaporization chamber 232.

Figure 4:
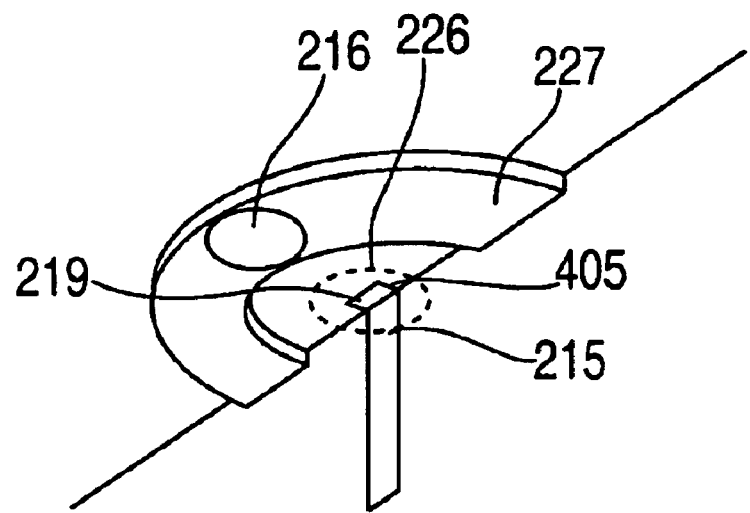
FIG. 4 is a cross-sectional view of a portion of the top view of the vaporizing chamber shown in FIG. 3.
Figure 5:
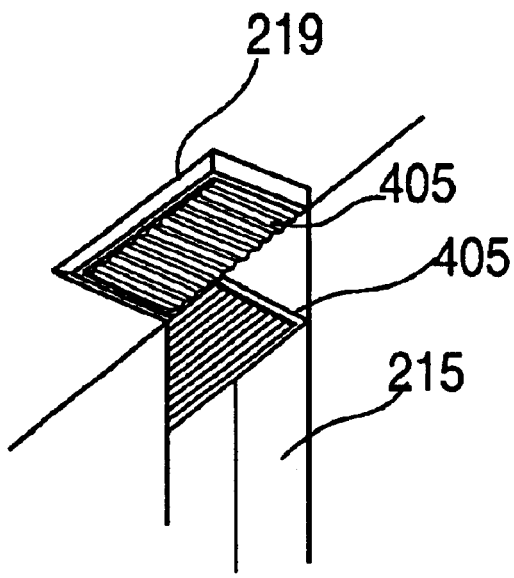
FIG. 5 is an expanded view of a portion of the liquid material outlet passage shown in FIG. 4.

FIG. 4 shows a cross-section of the upper surface 220 of the body block 213 depicted in FIG. 3, taken along line 1-1'. At least one grid 405 is positioned at the top of the liquid material inlet passage 215 near the liquid material outlet opening 219. The one or more grids 405 function to control the flow rate of the liquid material into the vaporizer chamber 232. The one or more grids 405 may optionally be positioned perpendicular to each other as shown in FIG. 5.

FIG. 6 illustrates a top view of a grid 405 including interlocking arrays of strips 502, 504 attached to a frame 500. Each strip in the array of strips 502 is electrically connected to the others via contacts 508. Each strip in the array of strips 504 is electrically connected to the others via contacts 506.

The strips 502, 504 are made of a piezoelectric material that expands uniformly in each direction and has a maximum material expansion of n. Thus, the distance between each of the strips 502, 504 should be no more than 2n and the distance between the edges of each strips 502, 504, and the frame 500 should be no more than n.

When the maximum expansion for the grid 405 is reached, the aperture opening thereof is zero. This is because each of the interlocking arrays expands such that adjacent strips 502, 504 touch one another as well as the edges of the frame.

Referring to FIGS. 7A–7B, the two or more grids 405 may be stacked perpendicular to one another such that the interlocking arrays of stripes 502, 504 form a plurality of pores 702. As the arrays of strips on each of the grids 405 expands to the maximum expansion of n, the diameter of each pore in the plurality of pores 702 is reduced to zero. The distance between each of the two or more grids 405 is variable. The distance between each of the grids is preferably less than about 1 cm.

The piezoelectric material should be formed of a material that is inert with respect to the liquid material to be vaporized. Additionally, the piezoelectric material should be inert with respect to pressure changes within the liquid material inlet passage 215, as well as vaporization temperatures, magnetic noise and electrical noise.

A voltage is applied to each of the arrays of strips 502, 504 through contacts 506, 508. The amount of expansion for each strip depends on the composition of the piezoelectric material as well as the magnitude of the applied voltage. As such, varying the voltage applied to the strips 502, 504 adjusts the size of the opening between adjacent strips, thereby affecting the flow rate of liquid material into the vaporizer chamber 232.

The piezoelectric materials should have a Young's modulus of less than about 250 GPa. Examples of suitable piezoelectric materials include barium titanate ($BaTiO_3$) and lead zirconate titanate (PZT), among others.

Typically, there is a pressure-drop across the one or more grids 405 between the liquid material inlet passage 215 and the vaporizing chamber 232. The liquid material (LM) is vaporized due to the pressure-drop along with the heating thereof in the vaporizing chamber 232. As a result a desired flow rate of gas (G) can be provided to the process chamber 110 (FIG. 1).

Referring to FIG. 3, a flow of vaporized liquid material radiates from the liquid material outlet opening 219 across the center portion 226 toward the groove 227. The carrier gas provided through carrier gas inlet passage 217 transports the vaporized liquid material out of the vaporizing chamber 232 through the gas outlet passage 216. The carrier gas may be, for example, an inert gas (IG), such as nitrogen ($N_2$), argon (Ar), or helium (He).

Alternatively, the vaporizing chamber 232 may be formed within the body block 213. Additionally, the heater 214 is not always positioned within the body block 213, as shown in FIG. 2. For example, a heater (not shown) may be wound around conduction lines 121, 123 to preliminarily heat the liquid material (LM) supplied to the injector/vaporizer 122, thereby providing the thermal energy required for the vaporization to the liquid material (LM) in the vaporizing chamber 232. For such an embodiment, vaporization of the liquid material (LM) within the injector/vaporizer 122 provides a larger flow rate of gas (G) to the process chamber 110 than for a heater 214 positioned within the body block 213.

A close proximity for the injector/vaporizer 122 to the process chamber 110 is preferred, so the vapor created does not have to travel over a large distance before dispersion into the process chamber 110. As such, less plating or clogging of transfer lines, such as conduction line 132, is likely. Moreover, the close proximity of the injector/vaporizer 122 to the chamber 110 significantly reduces the likelihood of pressure gradients that affect the deposition process.

For example, if the deposition system 10 is operating at a pressure of about 1.5 torr, a 0.5 torr drop in pressure is significant enough to degrade the properties of the film being deposited. Additionally, the close proximity of the injector/vaporizer 122 provides for faster processing of wafers by reducing the time lag associated with removing gaseous material from a conduction line after injector/vaporizer 122 shut-off. Byproducts of the deposition process can be pumped out of just the chamber instead of the extra volume of the delivery system also. Less excess process material is carried to the chamber which results in less extraneous deposition on chamber components and cross-contamination of neighboring chambers during wafer transfer.

The flow of liquid material (LM) through the injector/vaporizer 122 may be pulsed by alternately opening and closing the one or more grids 405. FIG. 8 depicts a flow diagram of the method of the present invention. The method 800 begins at step 802 with the one or more grids 405 (FIGS. 4–5) in the injector/vaporizer 122 at their maximum expansion, n, so the flow of liquid material (LM) into the vaporizing chamber 232 is shut-off.

In step 804, the one or more grids 405 are opened for a first peirod of time T1. The one or more grids 405 are opened by contracting one or more of the interlocking arrays of strips 502, 504. The strips 502, 504 may be contracted by varying the applied voltage provided through contacts 506, 508.

At step 806, the one or more grids 405 are expanded again to their maximum expansion, n, for a second time period T2, so the flow of liquid material (LM) into the vaporizing chamber 232 is shut-off. The opening and closing steps are repeatedly cycled at step 808 until a third period of time T3 has elapsed. After the third period of time has elapsed, the method ends at step 808 with the one or more grids 405 closed.

Figure 9:
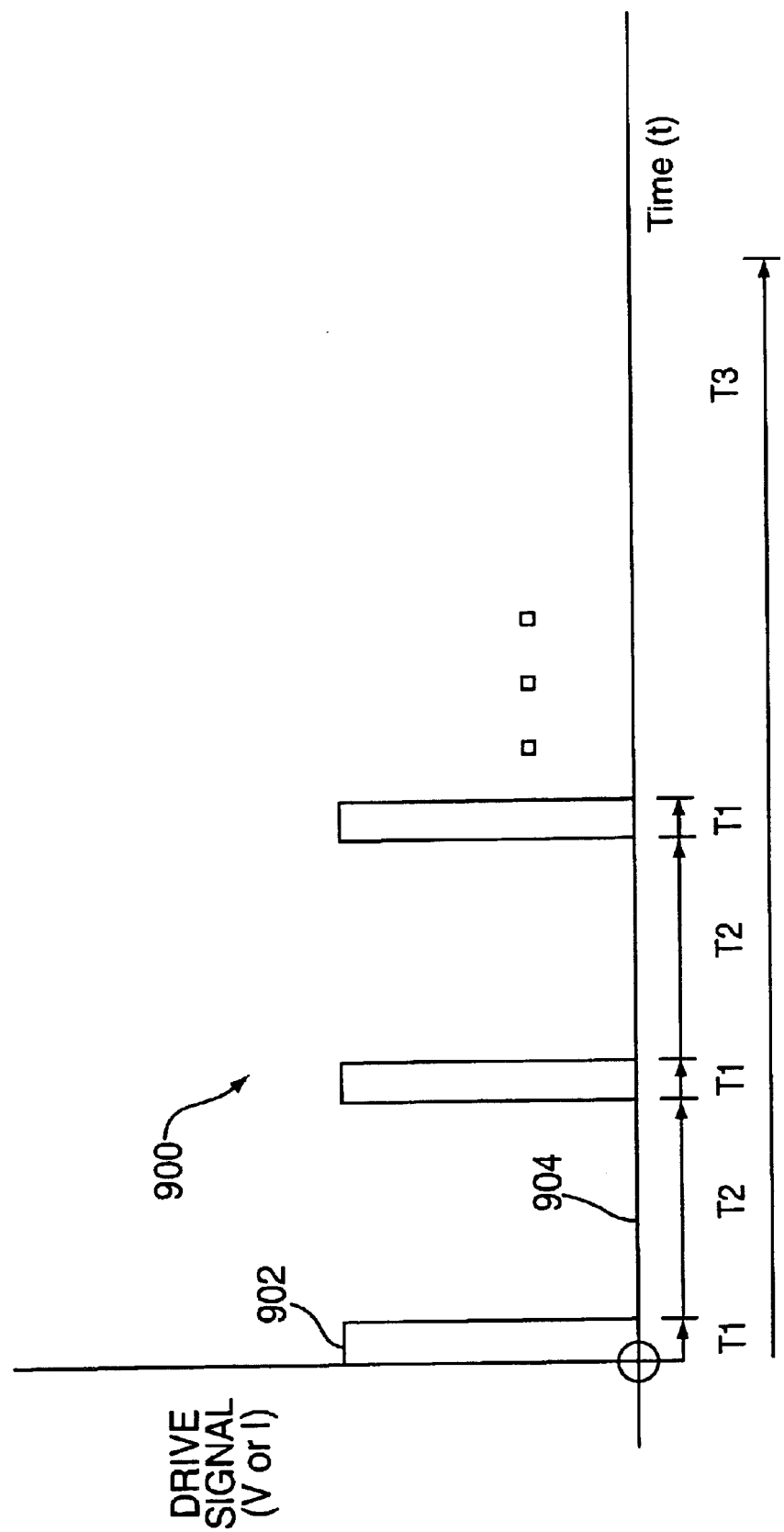
FIG. 9 depicts a timing diagram for operating the injector/vaporizer.

FIG. 9 depicts a timing diagram of a drive signal 900 produced by a controller (not shown) that controls the operation of the injector/vaporizer 122. The drive signal 900 represents a voltage or current delivered to the one or more piezoelectric grids 405. When the drive signal 900 is at first level 902, the arrays of strips 502, 504 are fully expanded to shut-off the flow of liquid material (LM). When the drive signal 900 is at a second level 904, the arrays of strips 502, 504 are not fully expanded to provide a flow of liquid material (LM) therethrough. The controller maintains the drive signal 900 at the first level 902 for a peirod of time T1. T1 is typically between approximately 2 milliseconds and 30 milliseconds. The controller then changes the signal 900 to level 904 for a peirod of time T2. T2 is typically between approximately 1 second and 10 seconds.

The one or more piezoelectric grids 405 expand or contract over a duty cycle of duration T1+T2. The flow rate can be adjusted between about 0.5 sccm to about 500 sccm by varying the parameters. For example, if the one or more piezoelectric grids 405 operate with about a 2 second duty cycle during which the piezoelectric grids 405 are open for approximately 5 milliseconds, the flow rate for the liquid material can be increased by decreasing time period T2, for fixed T1. Alternatively, decreasing time period T1, for fixed T2 decreases the flow rate.

For a fixed flow rate, the volume of liquid material flowing through the piezoelectric grids 405 can be controlled by repeating the duty cycle for a time period T3. T3 is typically between about 10 seconds to about 600 seconds. Additionally, T1 and T2 may be shifted up or down in the duty cycle so that the piezoelectric grids 405 are opened at any time during the duty cycle.

The injector/vaporizer 122 may be controlled by a processor based system controller 150 (FIG. 1). The system controller 150 includes a programmable central processing unit (CPU) (not shown) that is operable with a memory, a mass storage device, an input control unit, and a display unit. The system controller 150 further includes power supplies (not shown), clocks (not shown), cache (not shown), input/output (I/O) circuits (not shown) and the like. The system controller 150 also includes hardware for monitoring wafer processing through sensors (not shown) in the deposition chamber 110. Such sensors measure system parameters such as wafer temperature, chamber atmosphere pressure and the like. All of the above elements are coupled to a control system bus (not shown).

The memory contains instructions that the central processing unit (CPU) executes to facilitate the performance of the deposition system 110. The instructions in the memory are in the form of program code. The program code may conform to any one of a number of different programming languages. For example, the program code can be written in C, C++, BASIC, Pascal, as well as a number of other languages.

The mass storage device stores data and instructions and retrieves data and program code instructions from a processor readable storage medium, such as a magnetic disk or magnetic tape. For example, the mass storage device can be a hard disk drive, floppy disk drive, tape drive, or optical disk drive. The mass storage device stores and retrieves the instructions in response to directions that it receives from the central processing unit. Data and program code instructions that are stored and retrieved by the mass storage device are employed by the central processing unit for operating the deposition system 110. The data and program code instructions are first retrieved by the mass storage device from a medium and then transferred to the memory for use by the central processing unit.

The input control unit couples a data input device, such as a keyboard, mouse, or light pen, to the central processing unit to provide for the receipt of a chamber operator's inputs. The display unit provides information to a chamber operator in the form of graphical displays and alphanumeric characters under control of the central processing unit.

The control system bus provides for the transfer of data and control signals between all of the devices that are coupled to the control system bus. Although the control system bus is described as a single bus that directly connects the devices in the central processing unit, the control system bus can also be a collection of busses. For example, the display unit, input control unit and mass storage device can be coupled to an input-output peripheral bus, while the central processing unit and memory are coupled to a local processor bus. The local processor bus and input-output peripheral bus may be coupled together to form the control system bus.

The system controller 150 is coupled to various elements of the deposition system 110, via the control system bus and the I/O circuits. These elements may include the injector/controller 122 and the liquid flow meter 126. The system controller 150 provides signals to the chamber elements that cause these elements to perform operations for depositing a layer of material therein.

Although various embodiments which incorporate the teachings of the present invention have been shown and described in detail herein, those skilled in the art can readily devise many other varied embodiments that still incorporate these teachings.

What is claimed is:

1. An apparatus for controlling the flow of process material to a deposition chamber, comprising:
   an injector/vaporizer coupled to a deposition chamber, wherein the injector/vaporizer includes one or more grids positioned in a liquid material inlet passage that is connected to a vaporization chamber.

2. The apparatus of claim 1 wherein the one or more grids comprise a piezoelectric material.

3. The apparatus of claim 1 wherein the one or more grids each comprise at least one array of interlocking strips attached to a frame.

4. The apparatus of claim 3 wherein each strip of the at least one array of interlocking strip is electrically coupled to each other via contacts formed on the frame.

5. The apparatus of claim 3 wherein the at least one array of interlocking strips expand as a function of a voltage applied thereto.

6. The apparatus of claim 5 further comprising a controller coupled to the injector/vaporizer.

7. The apparatus of claim 6 wherein the controller causes the one or more grids to expand and contract according to a predetermined duty cycle.

8. The apparatus of claim 1 wherein two or more grids a positioned perpendicular to each other in the liquid material inlet passage.

9. An apparatus for controlling the flow of process material to a deposition chamber, comprising;
   an injector/vaporizer coupled to a deposition chamber, wherein the injector/vaporizer includes one or more piezoelectric grids positioned in a liquid material inlet passage that is connected to a vaporization chamber, and wherein the one or more grids each comprise at least one array of interlocking strips attached to a frame; and
   a controller coupled to the injector/vaporizer.

10. The apparatus of claim 9 wherein each strip of the at least one array of interlocking strips is electrically coupled to each other via contacts formed on the frame.

11. The apparatus of claim 10 wherein the at least one array of interlocking strips expand as a function of a voltage applied thereto.

12. The apparatus of claim 9 wherein two or more grids a positioned perpendicular to each other in the liquid material inlet passage.

13. The apparatus of claim 9 wherein the controller causes the one or more grids to expand and contract according to a predetermined duty cycle.

14. A deposition system for depositing a material on a substrate, comprising:
   a deposition chamber including a substrate support; and
   an injector/vaporizer coupled to a deposition chamber, wherein the injector/vaporizer includes one or more grids positioned in a liquid material inlet passage that is connected to a vaporization chamber.

15. The deposition of system of claim 14 wherein the one or more grids comprises a piezoelectric material.

16. The deposition system of claim 14 wherein the one or more grids each comprise at least one array of interlocking strips attached to a frame.

17. The deposition system of claim 16 wherein each strip of the at least one array of interlocking strips is electrically coupled to each other via contacts formed on the frame.

18. The deposition system of claim 16 wherein the at least one array of interlocking strips expand as a function of a voltage applied thereto.

19. The deposition system of claim 18, further comprising a controller coupled to the injector/vaporizer.

20. The deposition system of claim 19 wherein the controller causes the one or more grids to expand and contract according to a predetermined duty cycle.

21. A deposition system of claim 14 wherein two or more grids a positioned perpendicular to each other in the liquid material inlet passage.

22. A deposition system for depositing a material on a substrate, comprising:
   a deposition chamber including a substrate support;
   an injector/vaporizer coupled to a deposition chamber, wherein the injector/vaporizer includes one or more piezoelectric grids positioned in a liquid material inlet passage that is connected to a vaporization chamber, and wherein the one or more grids each comprise at least one array of interlocking strips attached to a frame; and
   a controller coupled to the injector/vaporizer.

23. The deposition system of claim 22 wherein each strip of the at least one array of interlocking strips is electrically coupled to each other via contacts formed on the frame.

24. The deposition system of claim 23 wherein the at least one array of interlocking strips expand as a function of a voltage applied thereto.

25. The deposition system of claim 22 wherein two or more grids a positioned perpendicular to each other in the liquid material inlet passage.

26. The deposition system of claim 22 wherein, the controller causes the one or more grids to expand and contract according to a predetermined duty cycle.

* * * * *